United States Patent
Yang

(10) Patent No.: US 11,984,891 B2
(45) Date of Patent: May 14, 2024

(54) DRIVING CIRCUIT AND SIGNAL CONVERTING CIRCUIT

(71) Applicant: REALTEK SEMICONDUCTOR CORPORATION, Hsinchu (TW)

(72) Inventor: Jun Yang, Suzhou (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/739,065

(22) Filed: May 6, 2022

(65) Prior Publication Data
US 2023/0098370 A1    Mar. 30, 2023

(30) Foreign Application Priority Data

Sep. 23, 2021    (CN) .......................... 202111116808.2

(51) Int. Cl.
*H03K 3/012*    (2006.01)
*H03K 5/01*    (2006.01)

(52) U.S. Cl.
CPC ............... *H03K 3/012* (2013.01); *H03K 5/01* (2013.01)

(58) Field of Classification Search
CPC .................................. H03K 3/012; H03K 5/01
See application file for complete search history.

(56) References Cited

U.S. PATENT DOCUMENTS

| 7,061,283 | B1 * | 6/2006 | Ghia ................... H04L 25/0288 327/108 |
| 11,139,843 | B1 * | 10/2021 | Li ............................ H04B 1/04 |
| 2019/0386694 | A1 * | 12/2019 | Miller ...................... H04B 1/16 |
| 2022/0286098 | A1 * | 9/2022 | Zhao ................... H03F 3/45188 |

OTHER PUBLICATIONS

Ahmedm. A. Ali, Huseyin Dinc, Paritosh Bhoraskar, Scott Bardsley, Chrisdillon, Mohit Kumar, Matthew McShea, Ryan Bunch, Joel Prabhakar, Scott Puckett, A 12b 18GS/s RF Sampling ADC with an Integrated Widebend Track-and-Hold Amplifier and Background Calibration, ISSCC 2020, Session 16, Nyqusit-Based ADCs, 16.1.

* cited by examiner

*Primary Examiner* — Sibin Chen
(74) *Attorney, Agent, or Firm* — WPAT, P.C.; Anthony King

(57) ABSTRACT

A driving current includes a first and second push-pull circuits which each includes a first and second output terminals and a first to fourth transistors. The first to fourth transistors are series connected. At least one of control terminals of the first and second transistors of the first push-pull circuit and at least one of control terminals of the third and fourth transistors of the second push-pull circuit receive a positive input signal. At least one of control terminals of the third and fourth transistors of the first push-pull circuit and at least one of control terminals of the first and second transistors of the second push-pull circuit receive a negative input signal. The first output terminals output a pair of first signals. The second output terminals output a pair of second signals.

20 Claims, 8 Drawing Sheets

DRIVING CIRCUIT AND SIGNAL CONVERTING CIRCUIT

CROSS-REFERENCE TO RELATED APPLICATIONS

This application claims the benefit of priority to Patent Application No. 202111116808.2, filed in China on Sep. 23, 2021, which is incorporated by reference in its entirety.

TECHNICAL FIELD

The present application relates to a driving circuit and a signal converting circuit, particularly to a driving circuit and a signal converting circuit including a split circuit.

BACKGROUND

When an amplitude of the differential signal is amplified or reduced, one of the positive terminal signal and the negative terminal signal draws energy from the power supply device and the other releases the energy to the ground. Since the released energy cannot be reused, the circuit does not use the energy efficiently. Therefore, how to use the energy efficiently in the circuit has become an urgent issue to be solved in this field.

SUMMARY OF THE INVENTION

An aspect of the present disclosure provides a driving circuit including a first push-pull circuit and a second push-pull circuit. The first push-pull circuit and the second push-pull circuit each includes a first output terminal, a second output terminal a first transistor, a second transistor, a third transistor and a fourth transistor. The first transistor is coupled between a first reference voltage and the first output terminal, the second transistor is coupled between the first output terminal and a circuit node, the third transistor is coupled between the circuit node and the second output terminal, and the fourth transistor is coupled between the second output terminal and a second reference voltage. At least one of a respective control terminal of the first and second transistors of the first push-pull circuit and at least one of a respective control terminal of the third and fourth transistors of the second push-pull circuit are configured to receive a positive terminal input signal of a pair of differential input signals. At least one of a respective control terminal of the third and fourth transistors of the first push-pull circuit and at least one of a respective control terminal of the first and second transistors of the second push-pull circuit are configured to receive a negative terminal input signal of the pair of differential input signals. The respective first output terminal of the first and second push-pull circuits are respectively configured to output a first positive terminal signal and a first negative terminal signal of a first pair of differential output signals. The respective second output terminal of the first and second push-pull circuits are respectively configured to output a second negative terminal signal and a second positive terminal signal of a second pair of differential output signals.

Another aspect of the present disclosure provides a signal converting circuit including a sampling circuit and a driving circuit. The sampling circuit is configured to sample a first pair of differential output signals and a second pair of differential output signals to generate a pair of differential converting signals. The driving circuit is coupled to the sampling circuit, and configured to generate the first pair of differential output signals and the second pair of differential output signals according to a pair of differential input signals. The driving circuit includes a first push-pull circuit and a second push-pull circuit. The first push-pull circuit has a first output terminal and a second output terminal, and is configured to generate a first positive terminal signal of the first pair of differential output signals on the first output terminal and generate a second negative terminal signal of the second pair of differential output signals on the second output terminal according to a positive terminal input signal and a negative terminal input signal of the pair of differential input signal. The second push-pull circuit has a third output terminal and a fourth output terminal, and is configured to generate a first negative terminal signal of the first pair of differential output signals on the third output terminal and generate a second positive terminal signal of the second pair of differential output signals on the fourth output terminal according to the positive terminal input signal and the negative terminal input signal. When the positive terminal input signal increases and the negative terminal input signal decreases, a portion of charges on the third output terminal are transmitted to the fourth output terminal, so that the first negative terminal signal decreases and the second positive terminal signal increases.

The driver circuit and the signal converting circuit of the present disclosure make efficient use of the energy that would otherwise be released to the ground, thereby enhancing energy utilization efficiency.

BRIEF DESCRIPTION OF THE DRAWINGS

Various aspects of the present application can best be understood upon reading the detailed description below and accompanying drawings. It should be noted that the various features in the drawings are not drawn to scale in accordance with standard practice in the art. In fact, the size of some features may be deliberately enlarged or reduced for the purpose of discussion.

DETAILED DESCRIPTION

Figure 1:
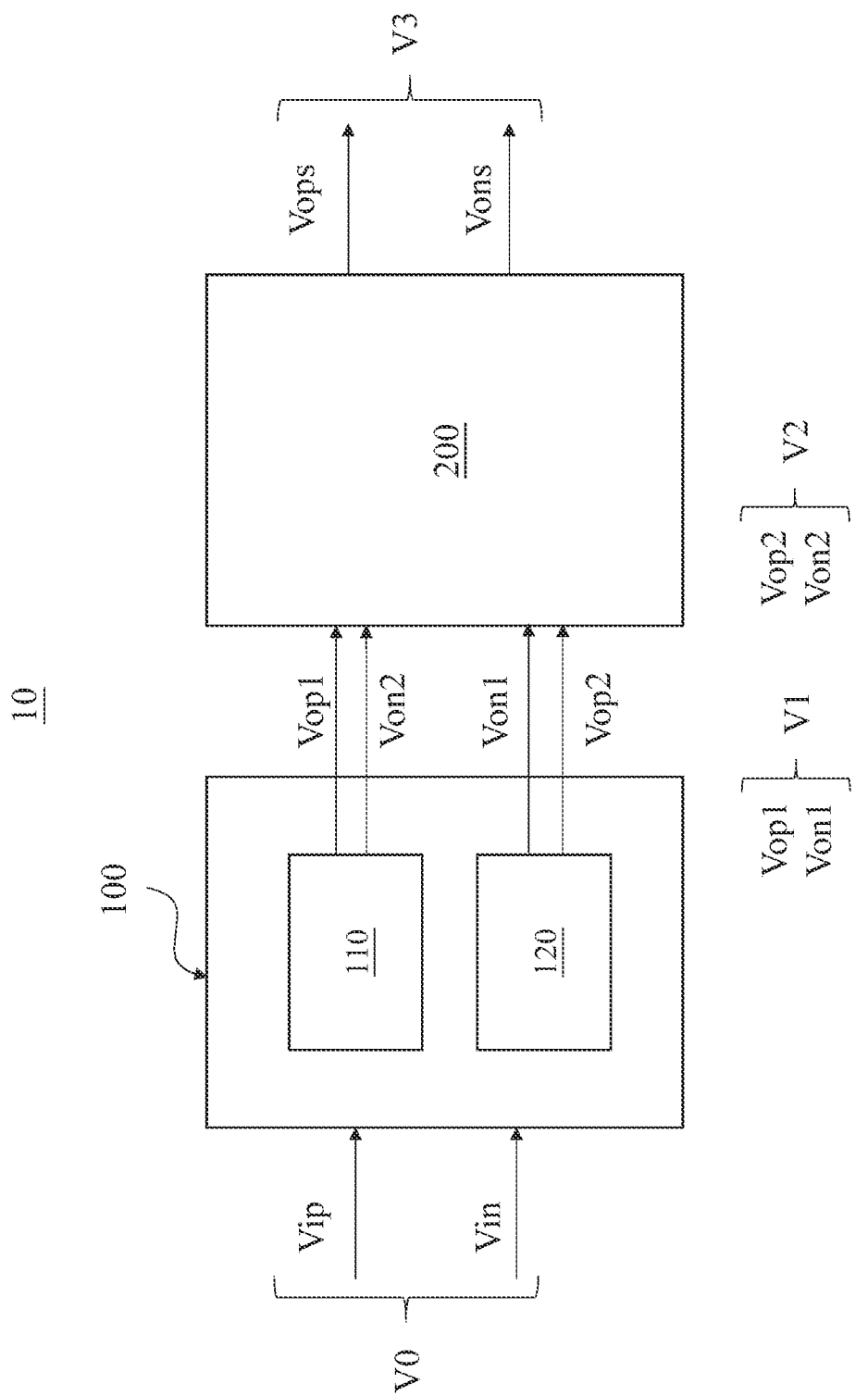
FIG. 1 is a schematic diagram illustrating a signal converting circuit according to some embodiments of the present disclosure.

FIG. 1 is a schematic diagram illustrating a signal converting circuit 10 according to some embodiments of the present disclosure. The signal converting circuit 10 includes a driving circuit 100 and a sampling circuit 200. The driving circuit 100 is configured to receive a pair of differential input signals V0 and output as a pair of differential output signals V1 and a pair of differential output signals V2. The sampling circuit 200 is configured to sample the pair of differential output signals V1 and the differential output signal V2 to generate the pair of differential converting signals V3. In some embodiments, the driving circuit 100 is a split differential signal buffer.

Specifically, the driving circuit 100 includes a push-pull circuit 110 and a push-pull circuit 120. The push-pull circuit 110 is configured to receive a positive terminal signal Vip and a negative terminal signal Vin of the differential input signal V0 to generate a positive terminal signal Vop1 of the differential output signal V1 and a negative terminal signal Von2 of the differential output signal V2, and the push-pull circuit 120 is configured to receive a positive terminal signal Vip and a negative terminal signal Vin to generate a negative terminal signal Von1 of the differential output signal V1 and a positive terminal signal Vop2 of the differential output signal V2. The sampling circuit 200 is configured to sample the positive terminal signal Vop1 and the positive terminal signal Vop2, and sample the negative terminal signal Von1 and the negative terminal signal Von2. Next, the sampling circuit 200 converts the sampled signals into a positive terminal signal Vops and a negative terminal signal Vons of the differential converting signal V3.

The relationship between the differential input signal V0, the differential output signals V1, V2, and the differential converting signal V3 can be expressed using the following equations:

$$Vop1=Vcm1+a*Vip;$$

$$Von1=Vcm1+a*Vin;$$

$$Vop2=Vcm2+b*Vip:$$

$$Von2=Vcm2+b*Vin:$$

$$Vops-Vons=(a*c+b*d)*(Vip-Vin);$$

wherein Vcm1 is a common-mode voltage of the differential output signal V1 (including the positive terminal signal Vop1 and negative terminal signal Von1), Vcm2 is a common-mode voltage of the differential output signal V2 (including the positive terminal signal Vop2 and the negative terminal signal Von2), a and b are the gains provided by the driving circuit 100, and c and d are the gains provided by the sampling circuit 200. In some embodiments, the common-mode voltage Vcm1 and the common-mode voltage Vcm2 are identical. In some other embodiments, the common-mode voltage Vcm1 and the common-mode voltage Vcm2 are different.

Figure 2:
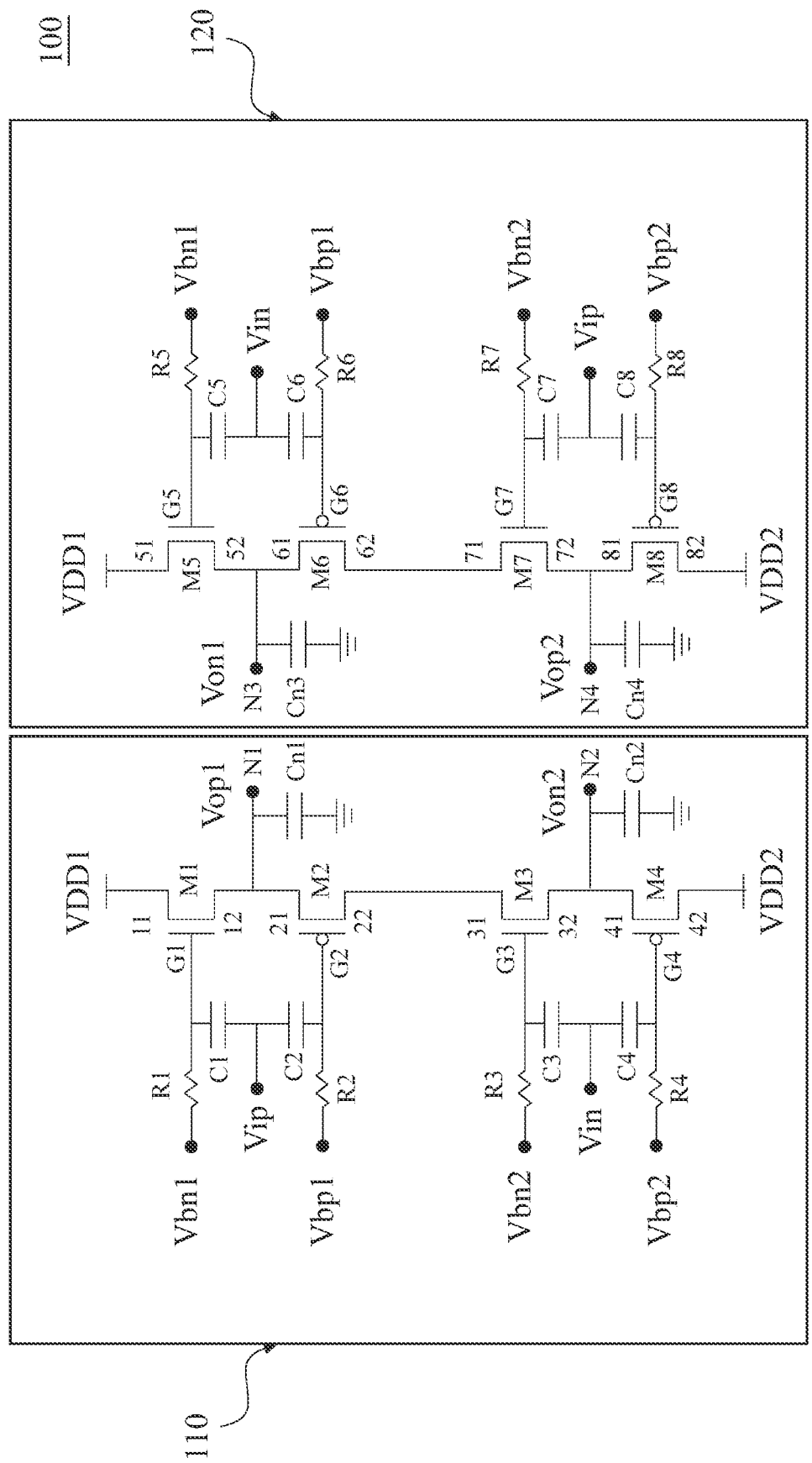
FIG. 2, FIG. 3, FIG. 4, FIG. 5, and FIG. 6 are schematic diagrams illustrating driving circuits according to some embodiments of the present disclosure.

Reference is made to FIG. 2. FIG. 2 is a schematic diagram illustrating the driving circuit 100 according to some embodiments of the present disclosure.

The push-pull circuit 110 includes an output terminal N1, an output terminal N2, transistors M1, M2, M3, M4, capacitors C1, C2, C3, C4, and resistors R1, R2, R3, R4. The first terminal 11 of the transistor M1 (which can be the source/drain, depending on the type of the transistor) is configured to receive a reference voltage VDD1; the second terminal 12 of the transistor M1 is coupled to the first terminal 21 of the transistor M2, wherein the second terminal 12 of the transistor M1 and the first terminal 21 of the transistor M2 are configured to generate the positive terminal signal Vop1 on an output terminal N1, the second terminal 22 of the transistor M2 is coupled to the first terminal 31 of the transistor M3; the second terminal 32 of the transistor M3 is coupled to the first terminal 41 of the transistor M4, wherein the second terminal 32 of the transistor M3 and the first terminal 41 of the transistor M4 are configured to generate the negative terminal signal Von2 on an output terminal N2; the second terminal 42 of the transistor M4 is configured to receive a reference voltage VDD2, wherein a reference voltage VDD1 is higher than the reference voltage VDD2. In some embodiments, the reference voltage VDD2 is connected to the ground. The control terminals G1-G4 of the transistors M1-M4 are respectively coupled to the first terminals of the resistors R1-R4. The second terminals of the resistors R1-R4 are respectively configured to receive bias voltages Vbn1, Vbp1, Vbn2, Vbp2. The first terminal of the capacitor C1 is coupled to the first terminal of the capacitor C2, and configured to receive the positive terminal signal Vip; the second terminal of the capacitor C1 is coupled to control terminal G1; the second terminal of the capacitor C2 is coupled to the control terminal G2. The first terminal of the capacitor C3 is coupled to the first terminal of the capacitor C4, and configured to receive the negative terminal signal Vin; the second terminal of the capacitor C3 is coupled to the control terminal G3; the second terminal of the capacitor C4 is coupled to the control terminal G4.

The push-pull circuit 110 and the push-pull circuit 120 are arranged symmetrically. The push-pull circuit 120 includes an output terminal N3, an output terminal N4, transistors M5, M6, M7, M8, capacitors C5, C6, C7, C8 and resistors R5, R6, R7, R8. The first terminal 51 of the transistor M5 is configured to receive a reference voltage VDD1; the second terminal 52 of the transistor M5 is coupled to the first terminal 61 of the transistor M6, wherein the second terminal 52 of the transistor M5 and the first terminal 61 of the transistor M6 are configured to generate the negative terminal signal Von1 on the output terminal N3; the second terminal 62 of the transistor M6 is coupled to the first terminal 71 of the transistor M7; the second terminal 72 of the transistor M7 is coupled to the first terminal 81 of the transistor M8, wherein the second terminal 72 of the transistor M7 and the first terminal 81 of the transistor M8 are configured to generate the positive terminal signal Vop2 on the output terminal N4; the second terminal 82 of the transistor M8 is configured to receive the reference voltage VDD2. The control terminals G5-G8 of the transistors M5-M8 are respectively coupled to the first terminals of the resistors R5-R8. The second terminals of the resistors R5-R8 are respectively configured to receive bias voltages Vbn1, Vbp1, Vbn2, Vbp2. The first terminal of the capacitor C5 is coupled to the first terminal of the capacitor C6, and configured to receive the negative terminal signal Vin; the second terminal of the capacitor C5 is coupled to the control terminal G5; the second terminal of the capacitor C6 is coupled to the control terminal G6. The first terminal of the capacitor C7 is coupled to the first terminal of the capacitor C8, and configured to receive the positive terminal signal Vip; the second terminal of the capacitor C7 is coupled to the control terminal G7; the second terminal of the capacitor C8 is coupled to the control terminal G8.

In some embodiments, the push-pull circuit 110 further includes a capacitor Cn1 and a capacitor Cn2. The capacitor Cn1 is coupled between the output terminal N1 and the ground terminal, and the capacitor Cn2 is coupled between the output terminal N2 and the ground terminal. Similarly, in some embodiments, the push-pull circuit 120 further includes a capacitor Cn3 and a capacitor Cn4. The capacitor Cn3 is coupled between the output terminal N3 and the ground terminal, and the capacitor Cn4 is coupled between the output terminal N4 and the ground terminal.

In the embodiment of FIG. 2, transistors M1, M3, M5, M7 are N-type transistors, and transistors M2, M4, M6, M8 are P-type transistors.

In some embodiments, transistors M1, M3, M5, M7 are pull-up transistors, and transistors M2, M4, M6, M8 are pull-down transistors.

When the positive terminal signal Vip increases and the negative terminal signal Vin decreases, in the push-pull circuit 110, it is easier to conduct the transistor M1 and harder to conduct the transistor M2, because the positive terminal signal Vip increases. The transistor M1 can drain more current (i.e., more energy) through the transistor M1 from the reference voltage VDD1, so that more charges are accumulated at the output terminal N1, which in turn raises the positive terminal signal Vop1. In contrast, reducing the negative terminal signal Vin makes it harder to conduct the transistor M3 and easier to conduct the transistor M4. The charges accumulated at the output terminal N2 are released to the reference voltage VDD2 through the transistor M4, which in turn decreases the negative terminal signal Von2.

Meanwhile, when the positive terminal signal Vip increases and the negative terminal signal Vin decreases, in the push-pull circuit 120, reducing the negative terminal signal Vin makes it harder to conduct the transistor M5 and easier to conduct the transistor M6. The charges accumulated at the output terminal N3 are released to the transistor M7 through the transistor M6, which in turn decreases the negative terminal signal Von1. Increasing the positive terminal signal Vip makes it easier to conduct the transistor M7 and harder to conduct the transistor M8. The charges released from the output terminal N3, after passing through the transistor M6 and then the transistor M7, are further transmitted to the output terminal N4, which in turn raises the positive terminal signal Vop2. Specifically, when the positive terminal signal Vip increases and the negative terminal signal Vin decreases, the positive terminal signals Vop1, Vop2 increase correspondingly, and the negative terminal signals Von1, Von2 decrease correspondingly. With respect to the positive terminal signal Vop2, at least a portion of the energy required to raise the positive terminal signal Vop2 is supplied by the energy released as the reduction of the negative terminal signal Von1. In other words, in this case, the energy required to raise the positive terminal signal Vop2 may not be drawn exclusively from the reference voltage VDD1, but may be provided by the energy released from other parts of the circuit. Compared with the prior art, the energy utilization efficiency of the present disclosure is better.

When the positive terminal signal Vip decreases and the negative terminal signal Vin increases, in the push-pull circuit 110, reducing the positive terminal signal Vip makes it harder to conduct the transistor M1 and easier to conduct the transistor M2. The charges accumulated at the output terminal N1 is released to the transistor M3 through the transistor M2, which in turn decreases the positive terminal signal Vop1. Increasing the negative terminal signal Vin makes it easier to conduct the transistor M3 and harder to conduct the transistor M4. The charges released from the output terminal N1, after passing the transistor M2 and then the transistor M3, are further transmitted to the output terminal N2, which in turn raises the negative terminal signal Von2. Specifically, when the positive terminal signal Vip decreases and the negative terminal signal Vin increases, at least a portion of the energy required to raise the negative terminal signal Von2 is supplied by the energy released as the reduction of the positive terminal signal Vop1. In other words, in this case, the energy required to raise the negative terminal signal Von2 may not be drawn exclusively from the reference voltage VDD1, but may be provided by the energy released from other parts of the circuit.

Meanwhile, when the positive terminal signal Vip decreases and the negative terminal signal Vin increases, in the push-pull circuit 120, increasing of the negative terminal signal Vin makes it easier to conduct the transistor M5 and harder to conduct the transistor M6. The transistor M5 draws more energy from the reference voltage VDD1 through the transistor M5, so that more charges are accumulated at the output terminal N3, which in turn raises the negative terminal signal Von1. In contrast, reducing the positive terminal signal Vip makes it harder to conduct the transistor M7 and easier to conduct the transistor M8. The charges accumulated at the output terminal N4 are released to the reference voltage VDD2 through the transistor M8, which in turn decreases the positive terminal signal Vop2.

The push-pull circuits 110, 120 of the present disclosure are not limited to the configuration shown in FIG. 2. Various configurations of the push-pull circuits 110, 120 are within the contemplated scope of the present disclosure. For example, in various embodiments, the push-pull circuits 110, 120 may be implemented using the configurations shown in FIGS. 3-6.

Figure 3:
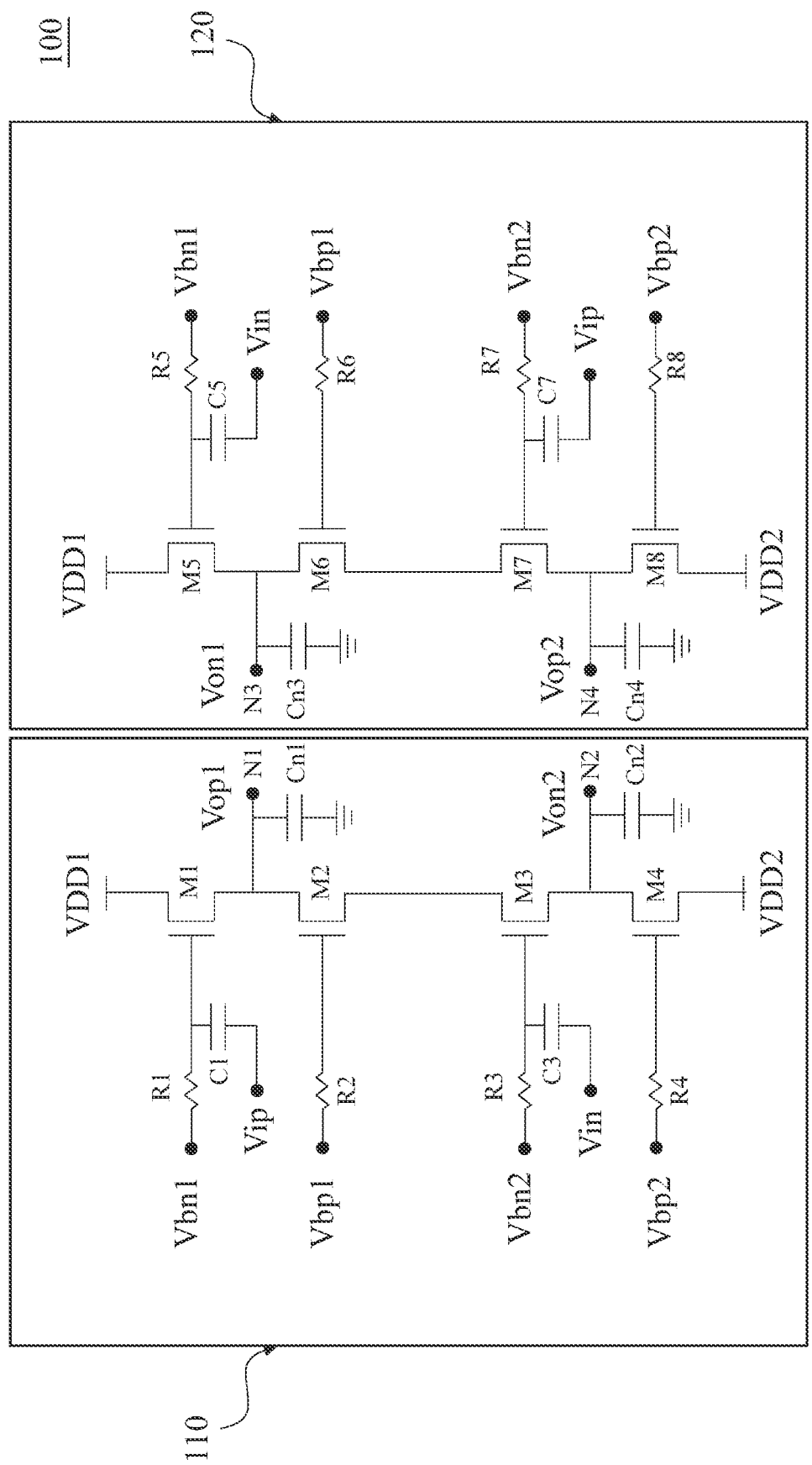

Reference is made to FIG. 3. Compared to the embodiment shown in FIG. 2, the push-pull circuit 110 does not include the capacitor C2 and the capacitor C4, and the push-pull circuit 120 does not include capacitor C6 and capacitor C8. Furthermore, transistors M1-M8 are N-type transistors.

Figure 4:
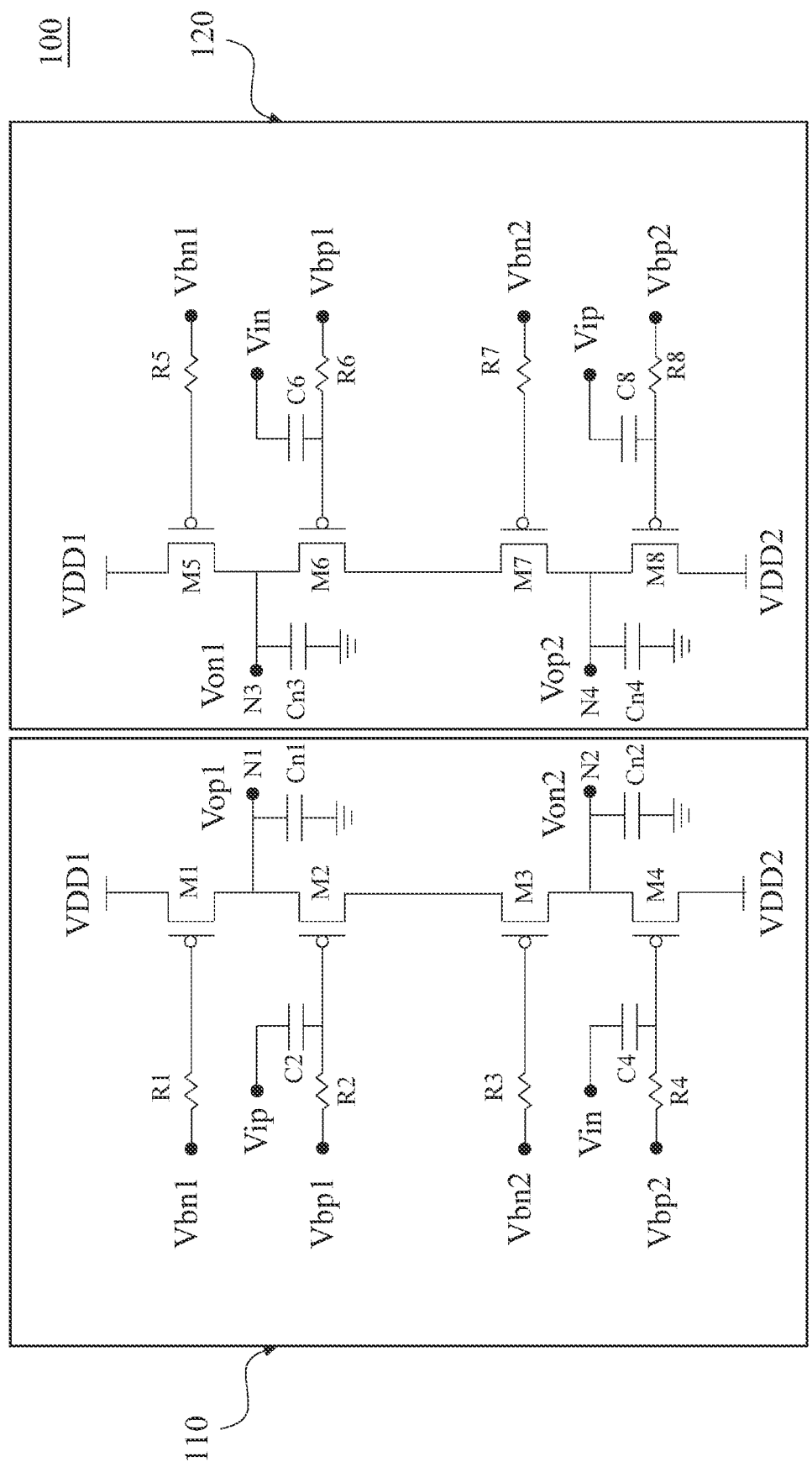

Reference is made to FIG. 4. Compared to the embodiment shown in FIG. 2, the push-pull circuit 110 does not include the capacitor C1 and the capacitor C3, and the push-pull circuit 120 does not include the capacitor C5 and the capacitor C7. Furthermore, transistors M1-M8 are P-type transistors.

Figure 5:
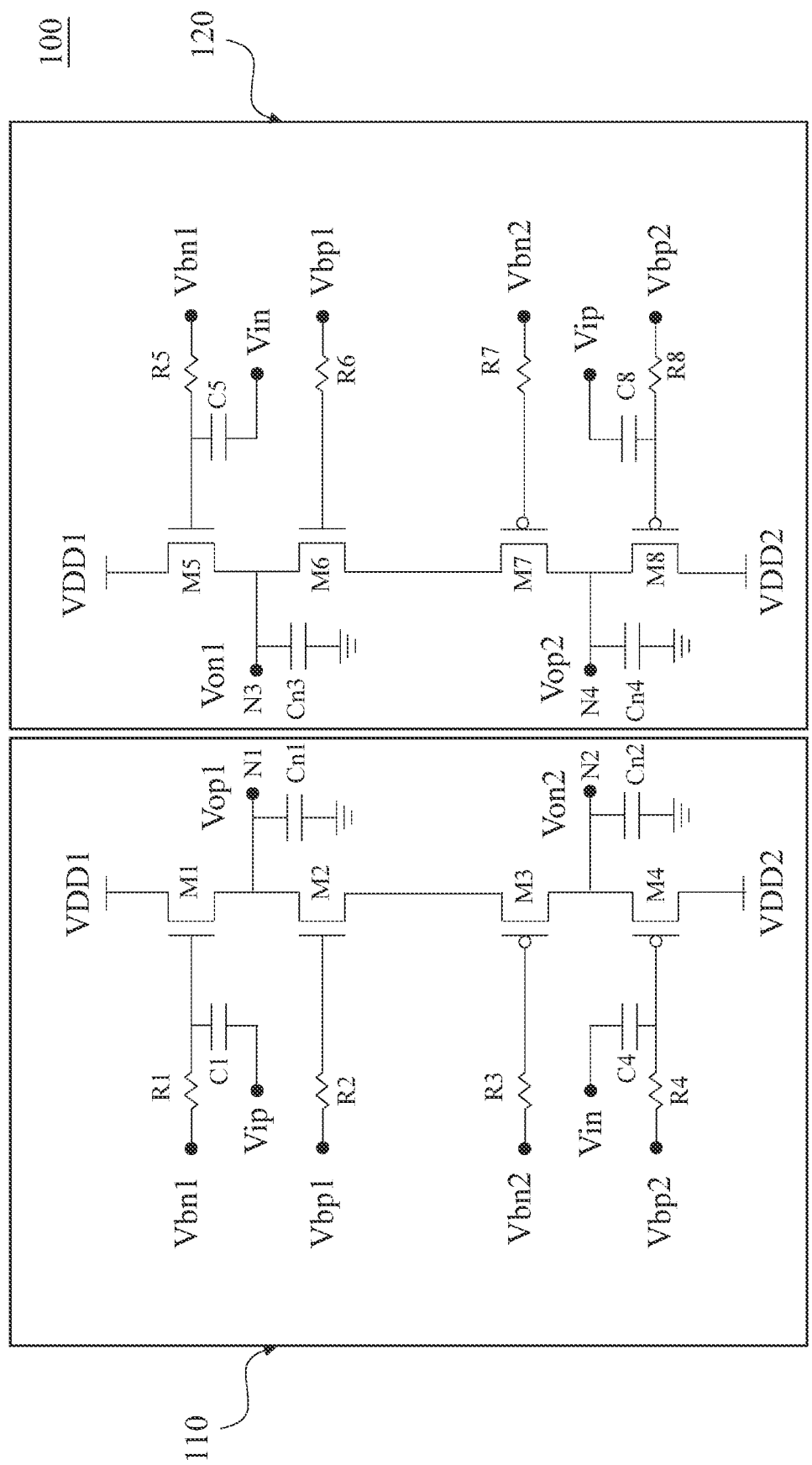

Reference is made to FIG. 5. Compared to the embodiment shown in FIG. 2, the push-pull circuit 110 does not include the capacitor C2 and the capacitor C3, and the push-pull circuit 120 does not include the capacitor C6 and the capacitor C7. Furthermore, transistors M1, M2, M5, M6 are N-type transistors, and transistors M3, M4, M7, M8 are P-type transistors.

Figure 6:
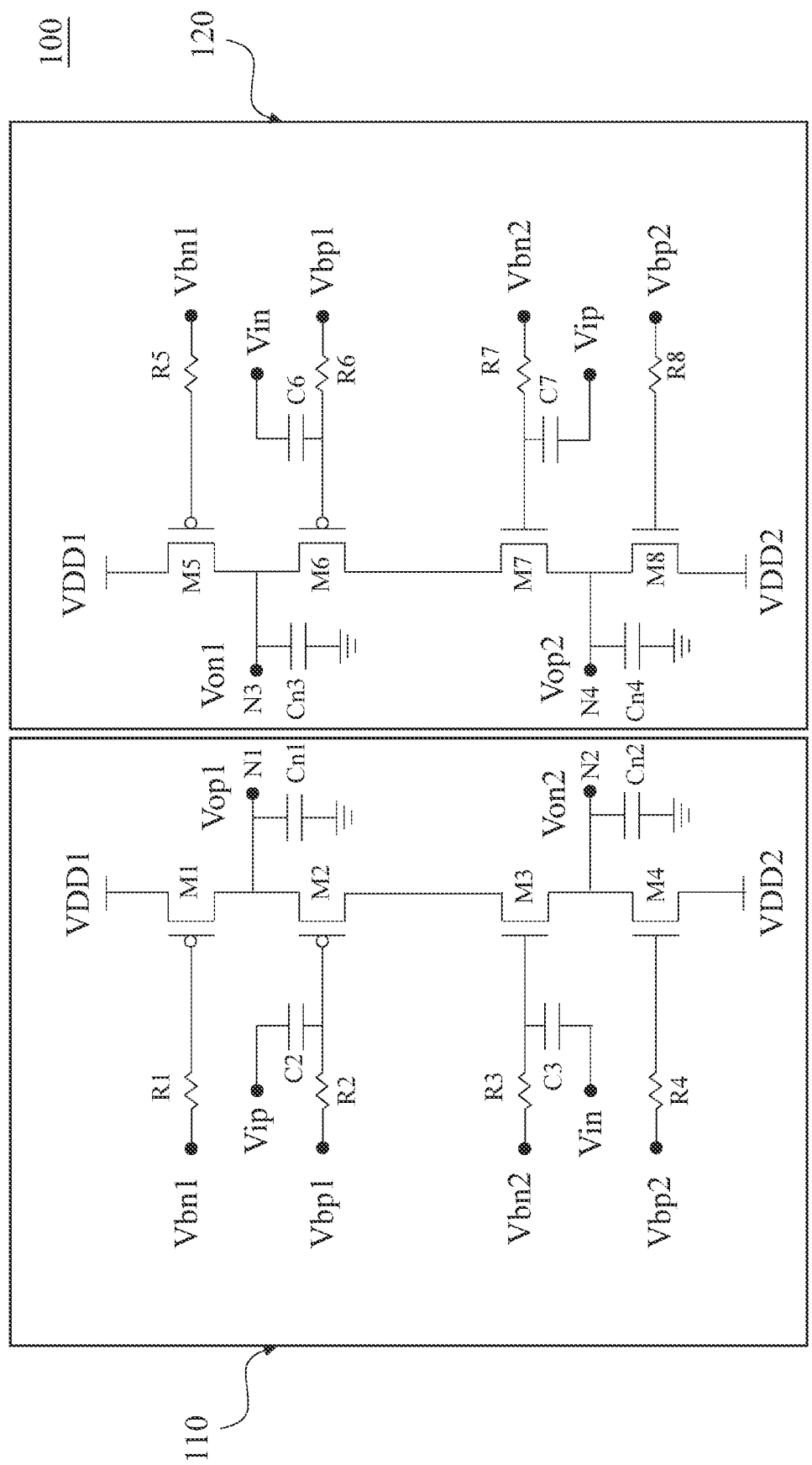

Reference is made to FIG. 6. Compared to the embodiment shown in FIG. 2, the push-pull circuit 110 does not include the capacitor C1 and the capacitor C4, and the push-pull circuit 120 does not include the capacitor C5 and the capacitor C8. Furthermore, transistors M1, M2, M5, M6 are P-type transistors, and transistors M3, M4, M7, M8 are N-type transistors.

For the sake of brevity, some of the reference numerals in FIGS. 3-6 are omitted. Because the operations of the embodiments shown in FIGS. 3-6 are similar to that of the embodiment shown in FIG. 2, the operating of the embodiments shown in FIGS. 3-6 are not repeated herein.

In view of the embodiments shown in FIGS. 2-6, at least one of the respective control terminals G1, G2 of the transistors M1, M2 of the push-pull circuit 110 and at least one of the respective control terminals G7, G8 of the transistors M7, M8 of the push-pull circuit 110 are configured to receive the positive terminal input signal Vip; at least one of the respective control terminals G3, G4 of the transistors M3, M4 of the push-pull circuit 110 and at least one of the respective control terminals G5. G6 of the transistors M5, M6 of the push-pull circuit 120 are configured to receive the negative terminal input signal Vin; the respective output terminals N1, N3 of the push-pull circuits 110, 120 are respectively configured to output the positive terminal signal Vop1 and the negative terminal signal Von1; and the respective output terminals N2, N4 of the push-pull circuits 110, 120 are respectively configured to output the negative terminal signal Von2 and the positive terminal signal Vop2.

Figure 7:
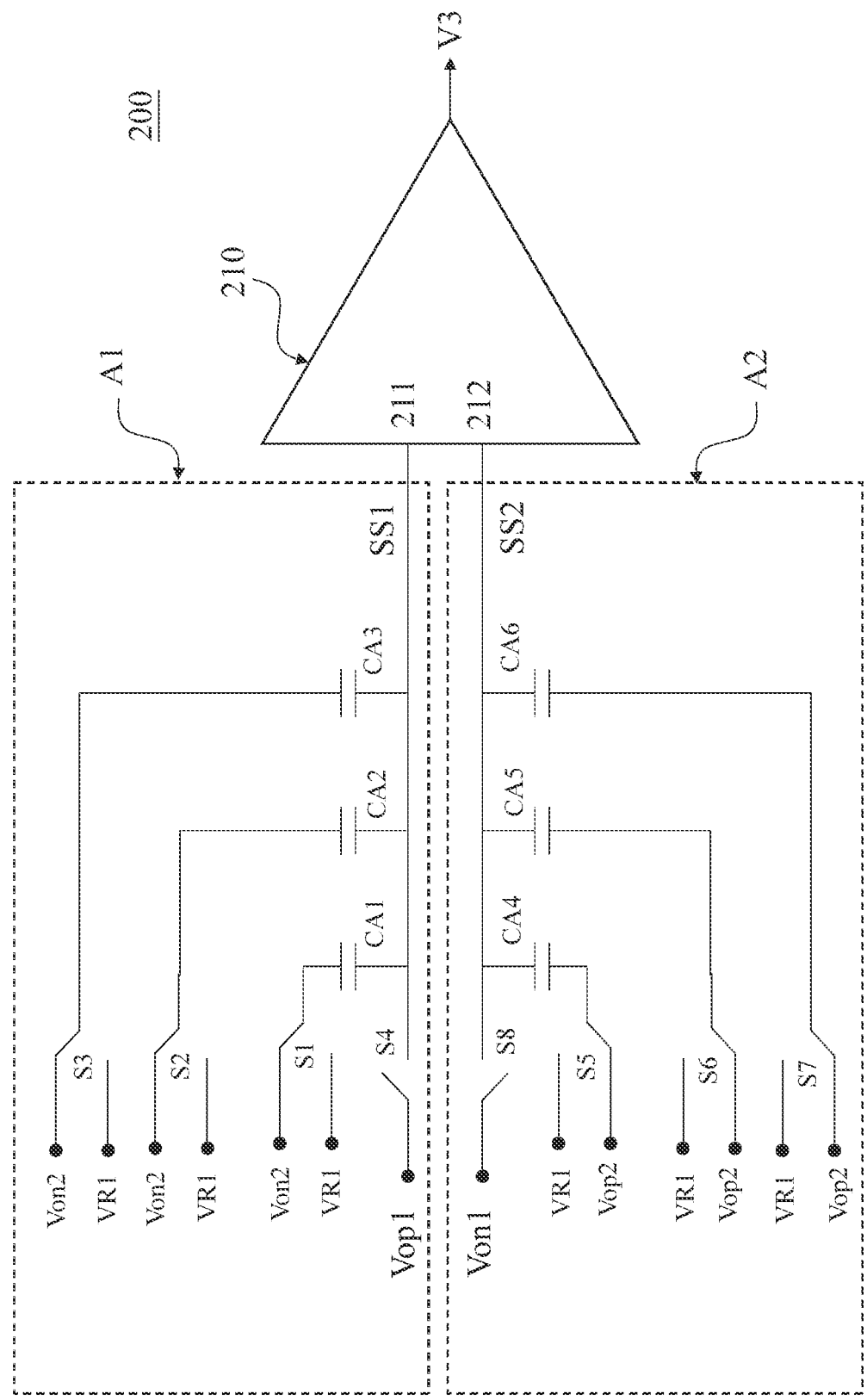
FIG. 7 and FIG. 8 are schematic diagrams illustrating sampling circuits according to some embodiments of the present disclosure.

Reference is made to FIG. 7. FIG. 7 is a schematic diagram illustrating the sampling circuit 200 according to some embodiments of the present disclosure. The sampling circuit 200 includes a sampling capacitor array A1, a sampling capacitor array A2 and a processing circuit 210. In some embodiments, the sampling circuit 200 is operated as a successive approximation register analog-to-digital converter (SAR ADC), and the processing circuit 210 is a comparator. In some other embodiments, the sampling circuit 200 is operated as a pipeline ADC, and the processing circuit 210 is an amplifier. In some embodiments, the switching operations of the sampling capacitor arrays A1, A2 is the same as those of a common SAR ADC or pipeline ADC.

The sampling capacitor array A1 includes capacitors CA1, CA2, CA3 and switches S1, S2, S3, S4. The first terminals of the capacitors CA1, CA2, CA3 are used as a first terminal of the sampling capacitor array A1 which is coupled to an input terminal 211 of the processing circuit 210, and configured to selectively receive the positive terminal signal Vop1 according to the switch S4 to generate a sampling signal SS1. The second terminals of the capacitors CA1, CA2, CA3 are respectively coupled to the first terminals of the switch S1, S2, S3. The second terminals of the switches S1, S2, S3 are used as a second terminal of the sampling capacitor array A1 and configured to selectively receive the negative terminal signal Von2 or a reference voltage VR1. During the sampling, the switches S1, S2, S3 couples the second terminals of the capacitors CA1, CA2, CA3 to the negative terminal signal Von2. After the sampling, the second terminals of the capacitors CA1, CA2, CA3 are coupled to the reference voltage VR1.

The sampling capacitor array A2 includes capacitors CA4, CA5. CA6 and switches S5, S6, S7, S8. The first terminals of the capacitors CA4, CA5, CA6 are used as a first terminal of the sampling capacitor array A2 which is coupled to an input terminal 212 of the processing circuit 210, and configured to selectively receive the negative terminal signal Von1 according to the switch S8 to generate a sampling signal SS2. The second terminals of the capacitors CA4, CA5, CA6 are respectively coupled to the first terminals of the switches S5, S6, S7. The second terminals of the switches S5, S6, S7 are used as a second terminals of the sampling capacitor array A2 and configured to selectively receive the positive terminal signal Vop2 or the reference voltage VR1. During the sampling, the switches S5, S6, S7 couple the second terminals of the capacitors CA4, CA5, CA6 to the positive terminal signal Vop2. After the sampling, the switches S5, S6, S7 couple the second terminals of the capacitors CA4, CA5, CA6 to the reference voltage VR1.

The processing circuit 210 generates the differential converting signal V3 according to the sampling signal SS1 and the sampling signal SS2.

In the embodiment of FIG. 7, the positive terminal signal Vop1 and the positive terminal signal Vop2 can be exchanged with each other; meanwhile, the negative terminal signal Von1 and the negative terminal signal Von2 can be exchanged with each other.

In some embodiments, a ratio of the capacitance of capacitors CA1, CA2, CA3 is 4:2:1, and a ratio of the capacitance of capacitors CA4, CA5, CA6 is 4:2:1. In this case, the capacitance of capacitors CA1, CA2, CA3 are respectively identical to the capacitance of capacitors CA4, CA5, CA6.

The sampling circuit 200 is not limited to the embodiment shown in FIG. 7. In other embodiments, the sampling capacitor arrays A1, A2 can be implemented as the configuration shown in FIG. 8.

Figure 8:
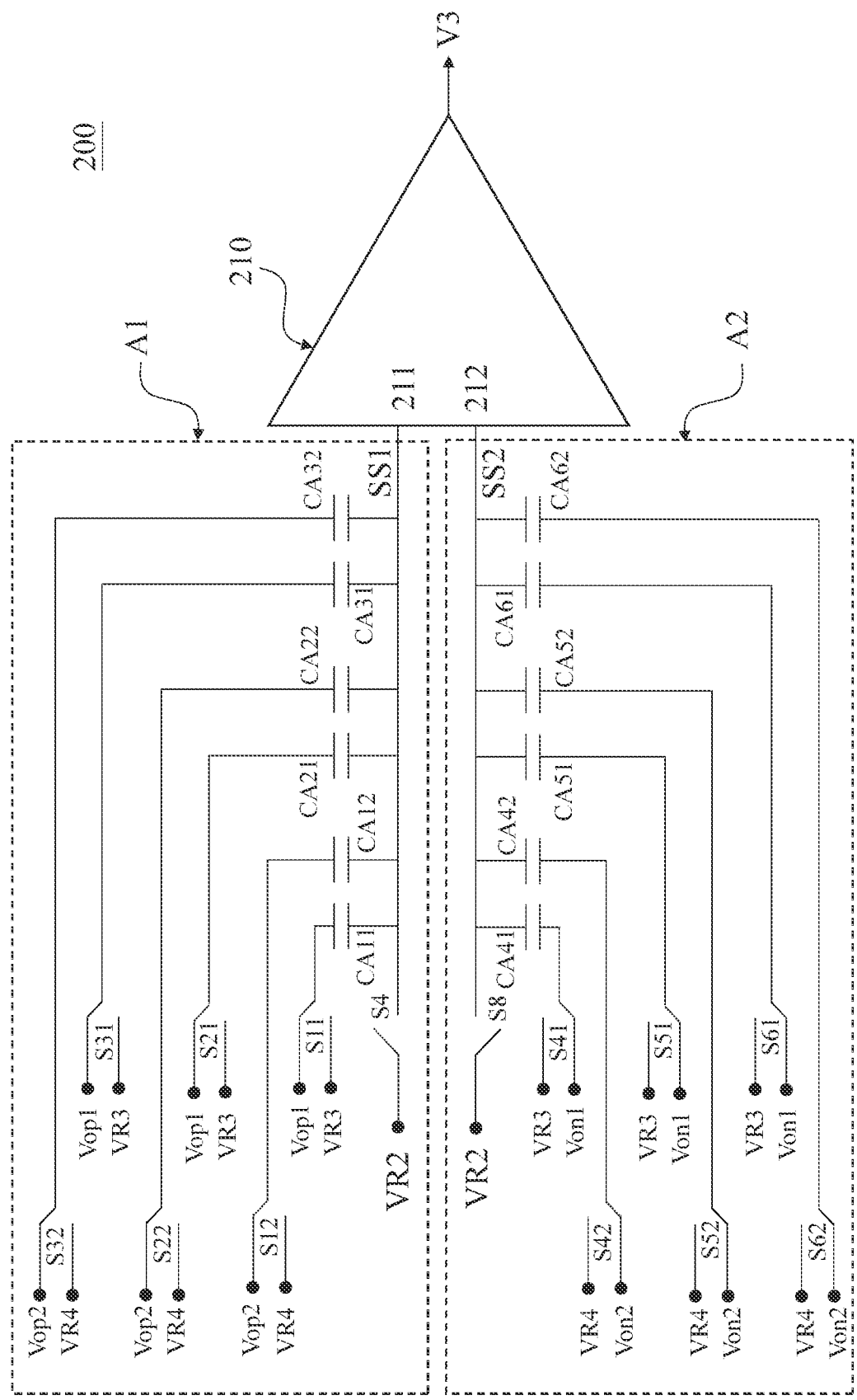

Reference is made to FIG. 8. The sampling capacitor array A1 includes capacitors CA11, CA12, CA21, CA22, CA31, CA32 and switches S11, S12, S21, S22, S31, S32, S4. The first terminals of the capacitors CA11, CA12, CA21, CA22, CA31, CA32 are used as the first terminal of the sampling capacitor array A1 which is coupled to the input terminal 211 of the processing circuit 210, and configured to selectively the receive reference signal VR2 according to the switch S4 to generate the sampling signal SS1. The second terminals of the capacitors CA11, CA12, CA21, CA22, CA31, CA32 are respectively coupled to the first terminals of the switches S11, S12, S21, S22, S31, S32. The second terminals of the switches S11, S21, S31 are used as the second terminal of the sampling capacitor array A1 and are configured to selectively receive the positive terminal signal Vop1 or a reference signal VR3, and the second terminals of the switches S12, S22, S32 are also used as the second terminals of the sampling capacitor array A1 and are configured to selectively receive the positive terminal signal Vop2 or a reference signal VR4. During the sampling, the switches S11, S21, S31 couple the second terminals of the capacitor CA11, CA21, CA31 to the positive terminal signal Vop1, and the switches S12, S22, S32 couple the second terminals of the capacitors CA12, CA22, CA32 to the positive terminal signal Vop2. After the sampling, the switches S11, S21, S31 couple the second terminal of the capacitors CA11, CA21, CA31 to the reference voltage VR3, and the switches S12, S22, S32 couple the second terminals of the capacitors CA12, CA22, CA32 to the reference voltage VR4.

The sampling capacitor array A2 includes capacitors CA41, CA42, CA51, CA52, CA61, CA62, and switches S41, S42, S51, S52, S61, S62, S8. The first terminals of the capacitors CA41, CA42, CA51, CA52, CA61, CA62 are used as the first terminal of the sampling capacitor array A2 which is coupled to the input terminal 212 of the processing circuit 210, and configured to selectively receive the reference signal VR2 according to the switch S8 to generate the sampling signal SS2. The second terminals of the capacitors CA41, CA42, CA51, CA52, CA61, CA62 are respectively coupled to the first terminals of the switches S41, S42, S51, S52, S61, S62. The second terminals of the switches S41, S51, S61 are used as the second terminal of the sampling capacitor array A2 and are configured to selectively receive the negative terminal signal Von1 or the reference signal VR3, and the second terminals of the switches S42, S52, S62 are also used as the second terminal of the sampling capacitor array A2 and are configured to selectively receive the negative terminal signal Von2 or the reference signal VR4. During the sampling, the switches S41, S51, S61 couple the second terminals of the capacitors CA41, CA51, CA61 to the negative terminal signal Von1, and the switches S42, S52, S62 couple the second terminals of the capacitors CA42, CA52, CA62 to the negative terminal signal Von2. After the sampling, the switches S41, S51, S61 couple the second terminals of the capacitors CA41, CA51, CA61 to the reference voltage VR3, and the switches S42, S52, S62 couple the second terminals of the capacitors CA42, CA52, CA62 to the reference voltage VR4.

In some embodiments, the capacitor CA11, the capacitor CA12, the capacitor CA41 and the capacitor CA42 have the same capacitance; the capacitor CA21, the capacitor CA22, the capacitor CA51 and the capacitor CA52 have the same capacitance; and the capacitor CA31, the capacitor CA32, the capacitor CA61 and the capacitor CA62 have the same capacitance. A ratio of the capacitance of the capacitors CA11, CA21, CA31 is 4:2:1, and a ratio of the capacitance of the capacitors CA41, CA51, CA61 is 4:2:1.

It is appreciated that the numbers of the capacitors in the sampling capacitor arrays A1 and A2 are not limited thereto. The sampling capacitor arrays A1 and A2 may include more capacitors, and the capacitance thereof is not limited to an increment in multiples of 2.

What is claimed is:

1. A driving circuit, comprising:
    a first push-pull circuit and a second push-pull circuit, each comprising:
        a first output terminal and a second output terminal; and
        a first transistor, a second transistor, a third transistor and a fourth transistor, wherein a first terminal of the first transistor is coupled to a first reference voltage, a second terminal of the first transistor is coupled to the first output terminal and a first terminal of the second transistor, a second terminal of the second transistor is coupled to a circuit node, the third transistor is coupled between the circuit node and the second output terminal, and the fourth transistor is coupled between the second output terminal and a second reference voltage,
    wherein at least one of a respective control terminal of the first and second transistors of the first push-pull circuit and at least one of a respective control terminal of the third and fourth transistors of the second push-pull circuit are configured to receive a positive terminal input signal of a pair of differential input signals, at least one of a respective control terminal of the third and fourth transistors of the first push-pull circuit and at least one of a respective control terminal of the first and second transistors of the second push-pull circuit are configured to receive a negative terminal input signal of the pair of differential input signals,
    wherein the respective first output terminal of the first and second push-pull circuits are respectively configured to output a first positive terminal signal and a first negative terminal signal of a first pair of differential output signals; the respective second output terminal of the first and second push-pull circuits are respectively configured to output a second negative terminal signal and a second positive terminal signal of a second pair of differential output signals.

2. The driving circuit of claim 1, wherein a first common-mode voltage of the first pair of differential output signals differs from a second common-mode voltage of the second pair of differential output signals.

3. The driving circuit of claim 1, wherein the first and third transistors of the first push-pull circuit and the first and third transistors of the second push-pull circuit are N-type transistors, and the second and fourth transistors of the first push-pull circuit and the second and fourth transistors of the second push-pull circuit are P-type transistors,
    wherein each push-pull circuit further comprises a first capacitor, a second capacitor, a third capacitor, and a fourth capacitor,
    wherein a respective first terminal of the first and second capacitors of the first push-pull circuit and a respective first terminal of the third and fourth capacitors of the second push-pull circuit are configured to receive the positive terminal input signal, and a respective second terminal of the first and second capacitors the third and fourth capacitors of the first push-pull circuit and the second push-pull circuit are respectively coupled to the respective control terminal of the first and second transistors of the first push-pull circuit and the respective first terminal of the third and fourth transistors of the second push-pull circuit, and
    a respective first terminal of the third and fourth capacitors of the first push-pull circuit and a respective first terminal of the first and second capacitors of the second push-pull circuit are configured to receive the negative terminal input signal, and a respective second terminal of the third and fourth capacitors of the first push-pull circuit and a respective second terminal of the first and second capacitors of the second push-pull are respectively coupled to the respective control terminal of the third and fourth transistors of the first push-pull circuit and the respective control terminal of the first and second transistors of the second push-pull circuit.

4. The driving circuit of claim 1, wherein the first transistor, the second transistor, the third transistor, and the fourth transistor of the first and second push-pull circuits are N-type transistors,
    wherein each of the first and second push-pull circuits further comprises a first capacitor and a second capacitor,
    wherein the first capacitor of the first push-pull circuit is coupled between the positive terminal input signal and the control terminal of the first transistor of the first push-pull circuit, the second capacitor of the first push-pull circuit is coupled between the negative terminal input signal and the control terminal of the third transistor of the first push-pull circuit, the first capacitor of the second push-pull circuit is coupled between the negative terminal input signal and the control terminal of the first transistor of the second push-pull circuit, and the second capacitor of the second push-pull circuit is coupled between the positive terminal input signal and the control terminal of the third transistor of the second push-pull circuit.

5. The driving circuit of claim 1, wherein the first transistor, the second transistor, the third transistor, and the fourth transistor of the first and second push-pull circuits are P-type transistors,
    wherein each of the first and second push-pull circuits further comprises a first capacitor and a second capacitor,
    wherein the first capacitor of the first push-pull circuit is coupled between the positive terminal input signal and the control terminal of the second transistor of the first push-pull circuit, the second capacitor of the first push-pull circuit is coupled between the negative terminal input signal and the control terminal of the fourth transistor of the first push-pull circuit, the first capacitor of the second push-pull circuit is coupled between the negative terminal input signal and the control terminal of the second transistor of the second push-pull circuit, and the second capacitor of the second push-pull circuit is coupled between the positive terminal input signal and the control terminal of the fourth transistor of the second push-pull circuit.

6. The driving circuit of claim 1, wherein the first transistor and the second transistor of each push-pull circuits are N-type transistors, and the third transistor and the fourth transistor of each push-pull circuit are P-type transistors,
    wherein each of the first and second push-pull circuits further comprises a first capacitor and a second capacitor,
    wherein the first capacitor of the first push-pull circuit is coupled between the positive terminal input signal and the control terminal of the first transistor of the first push-pull circuit, the second capacitor of the first push-pull circuit is coupled between the negative terminal input signal and the control terminal of the fourth transistor of the first push-pull circuit, the first capacitor of the second push-pull circuit is coupled between the negative terminal input signal and the control terminal of the first transistor of the second push-pull circuit, and the second capacitor of the second push-pull circuit is coupled between the positive terminal input signal and the control terminal of the fourth transistor of the second push-pull circuit.

7. The driving circuit of claim 1, wherein the first transistor and the second transistor of the first and second push-pull circuits are P-type transistors, the third transistor and the fourth transistor of the first and second push-pull circuits are N-type transistors, wherein each of the first and second push-pull circuits further comprises a first capacitor and a second capacitor, wherein the first capacitor of the first push-pull circuit is coupled between the positive terminal input signal and the control terminal of the second transistor of the first push-pull circuit, the second capacitor of the first push-pull circuit is coupled between the negative terminal input signal and the control terminal of the third transistor of the first push-pull circuit, the first capacitor of the second push-pull circuit is coupled between the negative terminal input signal and the control terminal of the second transistor of the second push-pull circuit, and the second capacitor of the second push-pull circuit is coupled between the positive terminal input signal and the control terminal of the third transistor of the second push-pull circuit.

8. The driving circuit of claim 1, wherein when the positive terminal input signal increases and the negative terminal input signal decreases, charges on the first output terminal of the second push-pull circuit are transmitted to the second output terminal of the second push-pull circuit through the second transistor and the third transistor of the second push-pull circuit, so that the first negative terminal signal decreases and the second positive terminal signal increases.

9. The driving circuit of claim 1, wherein when the positive terminal input signal decreases and the negative terminal input signal increases, charges on the first output terminal of the first push-pull circuit are transmitted to the second output terminal of the first push-pull circuit through the second transistor and the third transistor of the first push-pull circuit, so that the first positive terminal signal decreases and the second negative terminal signal increases.

10. A signal converting circuit, comprising:
a sampling circuit, configured to sample a first pair of differential output signals and a second pair of differential output signals to generate a pair of differential converting signals; and
a driving circuit, coupled to the sampling circuit, configured to generate the first pair of differential output signals and the second pair of differential output signals according to a pair of differential input signals, wherein the driving circuit comprises:
a first push-pull circuit, having a first output terminal and a second output terminal, configured to generate a first positive terminal signal of the first pair of differential output signals on the first output terminal and generate a second negative terminal signal of the second pair of differential output signals on the second output terminal according to a positive terminal input signal and a negative terminal input signal of the pair of differential input signal; and
a second push-pull circuit, having a third output terminal and a fourth output terminal, configured to generate a first negative terminal signal of the first pair of differential output signals on the third output terminal and generate a second positive terminal signal of the second pair of differential output signals on the fourth output terminal according to the positive terminal input signal and the negative terminal input signal,
wherein when the positive terminal input signal increases and the negative terminal input signal decreases, a portion of charges on the third output terminal are transmitted to the fourth output terminal, so that the first negative terminal signal decreases and the second positive terminal signal increases.

11. The signal converting circuit of claim 10, wherein when the positive terminal input signal decreases and the negative terminal input signal increases, a portion of the charges on the first output terminal are transmitted to the second output terminal, so that the first positive terminal signal decreases and the second negative terminal signal increases.

12. The signal converting circuit of claim 10, wherein the sampling circuit comprises:
a first sampling capacitor array, coupled to the first pair of differential output signals and the second pair of differential signal to generate a first sampling signal;
a second sampling capacitor array, coupled to the first pair of differential output signals and the second pair of differential signal to generate a second sampling signal; and
a processing circuit, having a first input terminal and a second input terminal, configured to receive the first sampling signal the second sampling signal from the first input terminal and the second input terminal, respectively, to generate the differential converting signals.

13. The signal converting circuit of claim 12, wherein first terminal and second terminal of each capacitor in the first sampling capacitor array are respectively configured to selectively receive the first positive terminal signal and the second negative terminal signal, and a first terminal and second terminal of each capacitor in the second sampling capacitor array are respectively configured to selectively receive the first negative terminal signal and the second positive terminal signal,
wherein the first terminal of each capacitor in the first sampling capacitor array is coupled to the first input terminal, and the first terminal of each capacitor in the second sampling capacitor array is coupled to the second input terminal.

14. The signal converting circuit of claim 12, wherein a first terminal of each capacitor in the first sampling capacitor array is coupled to the first input terminal, and configured to selectively receive a reference signal, a first terminal of each capacitor in the second sampling capacitor array is coupled to the second input terminal, and configured to selectively receive the reference signal, second terminals of a portion of the capacitors in the first sampling capacitor array are configured to receive the first positive terminal signal, second terminals of another portion of the capacitors in the first sampling capacitor array are configured to receive the second positive terminal signal, the second terminals of a portion of the capacitors in the second sampling capacitor array are configured to receive the first negative terminal signal, and second terminals of another portion of the capacitors in the second sampling capacitor array are configured to receive the second negative terminal signal.

15. The signal converting circuit of claim 10, wherein the first and second push-pull circuits comprise:
a first transistor, a second transistor, a third transistor and a fourth transistor, wherein in the first push-pull circuit, the first transistor is coupled between a first reference voltage and the first output terminal, the second transistor is coupled between the first output terminal and a circuit node; the third transistor is coupled between the circuit node and the second output terminal, and the fourth transistor is coupled between the second output terminal and a second reference voltage, wherein in the second push-pull circuit, the first transistor is coupled between the first reference voltage and the third output terminal, the second transistor is coupled between the third output terminal and the circuit node; the third transistor is coupled between the circuit node and the fourth output terminal, and the fourth transistor is coupled between the fourth output terminal and the second reference voltage wherein at least one of a respective control terminal of the first and second transistors of the first push-pull circuit and at least one of a respective control terminal of the third and fourth transistors of the second push-pull circuit are configured to receive the positive terminal input signal, at least one of a respective control terminal of the third and fourth transistors of the first push-pull circuit and at least one of a respective control terminal of the first and second transistors of the second push-pull circuit are configured to receive the negative terminal input signal, the first output terminal of the first and second push-pull circuits are respectively configured to output the first positive terminal signal and the first negative terminal signal, the second output terminal of the first and second push-pull circuits are respectively configured to output the second negative terminal signal and the second positive terminal signal.

16. The signal converting circuit of claim 15, wherein the first and third transistors of the first push-pull circuit and the first and third transistors of the second push-pull circuit are N-type transistors, and the second and fourth transistors of the first push-pull circuit and the second and fourth transistors of the second push-pull circuit are all P-type transistors, wherein each of the first and second push-pull circuits further comprises a first capacitor, a second capacitor, a third capacitor and a fourth capacitor, wherein a respective first terminal of the first and second capacitors of the first push-pull circuit and a respective first terminal of the third and fourth capacitors of the second push-pull circuit are configured to receive the positive terminal input signal, and second terminals of the first and second capacitors of the first push-pull circuit and second terminals of the third and fourth capacitors of the second push-pull circuit are respectively coupled to the control terminals of the first and second transistors of the first push-pull circuit and the control terminals of the third and fourth transistors of the second push-pull circuit, and a respective first terminal of the third and fourth capacitors of the first push-pull circuit and a respective first terminal of the first and second capacitors of the second push-pull circuit are configured to receive the negative terminal input signal, and second terminals of the third and fourth capacitors of the first push-pull circuit and second terminals of the first and second capacitors of the second push-pull circuit are respectively coupled to control terminals of the third and fourth transistors of the first push-pull circuit and control terminals of the first and second transistors of the second push-pull circuit.

17. The signal converting circuit of claim 15, wherein the first transistor, the second transistor, the third transistor, and the fourth transistor of the first and second push-pull circuits are N-type transistors, wherein each of the first and second push-pull circuits further comprises a first capacitor and a second capacitor, wherein the first capacitor of the first push-pull circuit is coupled between the positive terminal input signal and the control terminal of the first transistor of the first push-pull circuit, the second capacitor of the first push-pull circuit is coupled between the negative terminal input signal and the control terminal of the third transistor of the first push-pull circuit, the first capacitor of the second push-pull circuit is coupled between the negative terminal input signal and the control terminal of the first transistor of the second push-pull circuit, and the second capacitor of the second push-pull circuit is coupled between the positive terminal input signal and the control terminal of the third transistor of the second push-pull circuit.

18. The signal converting circuit of claim 15, wherein the first transistor, the second transistor, the third transistor, and the fourth transistor of the first and second push-pull circuits are P-type transistors, wherein each of the first and second push-pull circuits further comprise a first capacitor and a second capacitor, wherein the first capacitor of the first push-pull circuit is coupled between the positive terminal input signal and the control terminal of the second transistor of the first push-pull circuit, the second capacitor of the first push-pull circuit is coupled between the negative terminal input signal and the control terminal of the fourth transistor of the first push-pull circuit, the first capacitor of the second push-pull circuit is coupled between the negative terminal input signal and the control terminal of the second transistor of the second push-pull circuit, and the second capacitor of the second push-pull circuit is coupled between the positive terminal input signal and the control terminal of the fourth transistor of the second push-pull circuit.

19. The signal converting circuit of claim 15, wherein the first transistor and the second transistor of the first and second push-pull circuits are N-type transistors, and the third transistor and the fourth transistor of the first and second push-pull circuits are P-type transistors, wherein each of the first and second push-pull circuits further comprises a first capacitor and a second capacitor, wherein the first capacitor of the first push-pull circuit is coupled between the positive terminal input signal and the control terminal of the first transistor of the first push-pull circuit, the second capacitor of the first push-pull circuit is coupled between the negative terminal input signal and the control terminal of the fourth transistor of the first push-pull circuit, the first capacitor of the second push-pull circuit is coupled between the negative terminal input signal and the control terminal of the first transistor of the second push-pull circuit, and the second capacitor of the second push-pull circuit is coupled between the positive terminal input signal and the control terminal of the fourth transistor of the second push-pull circuit.

20. The signal converting circuit of claim 15, wherein the first transistor and the second transistor of the first and second push-pull circuits are P-type transistors, and the third transistor and the fourth transistor of the first and second push-pull circuits are N-type transistors,
  wherein each of the first and second push-pull circuits further comprise a first capacitor and a second capacitor,
  wherein the first capacitor of the first push-pull circuit is coupled between the positive terminal input signal and the control terminal of the second transistor of the first push-pull circuit, the second capacitor of the first push-pull circuit is coupled between the negative terminal input signal and the control terminal of the third transistor of the first push-pull circuit, the first capacitor of the second push-pull circuit is coupled between the negative terminal input signal and the control terminal of the second transistor of the second push-pull circuit, and the second capacitor of the second push-pull circuit is coupled between the positive terminal input signal and the control terminal of the third transistor of the second push-pull circuit.

* * * * *